(12) United States Patent
Sun et al.

(10) Patent No.: US 10,248,498 B2
(45) Date of Patent: Apr. 2, 2019

(54) CYCLIC REDUNDANCY CHECK CALCULATION FOR MULTIPLE BLOCKS OF A MESSAGE

(71) Applicant: Futurewei Technologies, Inc., Plano, TX (US)

(72) Inventors: Yan Sun, Santa Clara, CA (US); YunSong Lu, Mountain View, CA (US); Wenzhe Zhou, Cupertino, CA (US)

(73) Assignee: Futurewei Technologies, Inc., Plano, TX (US)

( * ) Notice: Subject to any disclaimer, the term of this patent is extended or adjusted under 35 U.S.C. 154(b) by 145 days.

(21) Appl. No.: 15/357,296

(22) Filed: Nov. 21, 2016

(65) Prior Publication Data
US 2018/0143872 A1    May 24, 2018

(51) Int. Cl.
| | | |
|---|---|---|
| *G06F 11/00* | (2006.01) | |
| *H03M 13/00* | (2006.01) | |
| *G06F 11/10* | (2006.01) | |
| *H03M 13/09* | (2006.01) | |

(52) U.S. Cl.
CPC ......... *G06F 11/1004* (2013.01); *H03M 13/09* (2013.01); *H03M 13/091* (2013.01); *H03M 13/6502* (2013.01)

(58) Field of Classification Search
CPC ............ G05F 11/1004; G06F 11/1004; H03M 13/09; H03M 13/091; H03M 13/6502
USPC ........ 714/807, 808, 752, 757, 758, 759, 772
See application file for complete search history.

(56) References Cited

U.S. PATENT DOCUMENTS

| | | | | |
|---|---|---|---|---|
| 3,789,204 | A * | 1/1974 | Barlow | G06F 11/1016 365/201 |
| 4,996,690 | A * | 2/1991 | George | G06F 11/10 714/781 |
| 5,517,514 | A * | 5/1996 | Norrie | G06F 11/10 714/800 |
| 2004/0015767 | A1 | 1/2004 | Futagi et al. | |

FOREIGN PATENT DOCUMENTS

| | | |
|---|---|---|
| CN | 1465157 A | 12/2003 |
| CN | 101615986 A | 12/2009 |
| CN | 102136887 A | 7/2011 |
| CN | 105119694 | 12/2015 |
| WO | 2009022874 A1 | 2/2009 |

OTHER PUBLICATIONS

PCT/CN2017/109974, ISR, dated Jan. 26, 2018.
Yan Sun and Min Sue Kim, "A Table-Based Algorithm for Pipelined CRC Calculation," in Communications (ICC), 2010 IEEE International Conference, Cape Town, South Africa, 2010, pp. 1-5.

* cited by examiner

*Primary Examiner* — Christine T. Tu
(74) *Attorney, Agent, or Firm* — Vierra Magen Marcus LLP

(57) ABSTRACT

The disclosure relates to technology performing a cyclic redundancy check (CRC). Data is divided into a plurality of blocks, each of the plurality of blocks having a fixed size equal to a degree of a generator polynomial. A CRC computation is independently performed on each of the plurality of blocks, and the CRC computation for each of the plurality of blocks is combined by application of an exclusive or (XOR) operation.

21 Claims, 8 Drawing Sheets

(CRC generator)

(CRC decoder)

CYCLIC REDUNDANCY CHECK CALCULATION FOR MULTIPLE BLOCKS OF A MESSAGE

BACKGROUND

A cyclical redundancy check (CRC) is a type of function that is used to detect errors in digital data. A typical n-bit CRC (e.g., CRC-8, CRC-16, CRC-32, etc.) receives a data block as input represented as a binary value. The binary value is then divided by a predetermined n-bit binary divisor to generate a remainder that is characteristic of the data block. The remainder may be used as a checksum to determine, for example, if the data block is later altered during transmission or storage.

In the field of data communications, network protocols such as Ethernet, ATM, and the like employ CRCs to detect transmission errors in messages (i.e., data packets or frames) that are sent from one network device to another. For example, in a conventional Ethernet implementation, a transmitting network device (e.g., router, switch, host network interface, etc.) generates a CRC-32 value for each outgoing Ethernet frame, and appends the value to the frame prior to transmission. When the frame is received at a receiving network device, the CRC-32 value is stripped and a new CRC-32 value is generated for the frame. The new CRC-32 value is then compared to the received CRC-32 value to verify the integrity of the data contained within the frame. However, conventional CRC processing circuit implementations cannot efficiently support the high data throughput rates demanded by emerging wire transmission standards, such as 100 G (i.e., 100 Gigabits per second (Gbps)) Ethernet.

BRIEF SUMMARY

In a first embodiment, there is a method for performing a cyclic redundancy check (CRC), comprising dividing data into a plurality of blocks, each of the plurality of blocks having a fixed size equal to a degree of a generator polynomial; independently performing a CRC computation for each of the plurality of blocks; and combining the CRC computation for each of the plurality of blocks by application of an exclusive or (XOR) operation.

In a second embodiment according to the first embodiment, the independently performing a CRC computation for each of the plurality of blocks comprises: for each block in which at least one bit has been modified, applying the XOR operation to the block for which the at least one bit has been modified and a corresponding original block of the data to generate an XOR value; appending trailing zeroes to the XOR value and performing the CRC computation on the XOR value including the appended trailing zeroes to generate a CRC value; and applying the XOR operation to the generated CRC value and a CRC value of the data.

In a third embodiment according to any of the first through second embodiments, wherein the CRC computations are independently performed in parallel.

In a fourth embodiment according to any of the first through third embodiments, for each block, including the trailing zeroes, having a length smaller than the degree of the generator polynomial, the CRC value is the block.

In a fifth embodiment according to any of the first through fourth embodiments, the CRC computations are performed by accessing one or more lookup tables that include pre-calculated CRCs.

In a sixth embodiment according to any of the first through fifth embodiments, further comprising stopping the CRC computations in response to the XOR data with appended trailing zeroes falling into a loop and a length of the loop is less than a predefined value.

In a seventh embodiment according to any of the first through sixth embodiments, the method further comprising: determining whether the CRC computation is being performed on a last block of the plurality of blocks, in response to determining that the CRC computation has been performed on the last block, proceed to combining the CRC computation for each of the plurality of blocks.

In an eighth embodiment, there is a non-transitory computer-readable medium storing computer instructions for performing a cyclic redundancy check (CRC), that when executed by one or more processors, perform the steps of dividing data into a plurality of blocks, each of the plurality of blocks having a fixed size equal to a degree of a generator polynomial; independently performing a CRC computation for each of the plurality of blocks; and combining the CRC computation for each of the plurality of blocks by application of an exclusive or (XOR) operation.

In an ninth embodiment, there is a network device for performing a cyclic redundancy check (CRC), comprising a non-transitory memory storage comprising instructions; and one or more processors in communication with the memory, wherein the one or more processors execute the instructions to: divide data into a plurality of blocks, each of the plurality of blocks having a fixed size equal to a degree of a generator polynomial; independently perform a CRC computation for each of the plurality of blocks; and combine the CRC computation for each of the plurality of blocks by application of an exclusive or (XOR) operation.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

DETAILED DESCRIPTION

The disclosure relates to technology for performing a cyclic redundancy check (CRC) data transmitted and received between and/or within systems, devices or components. Traditionally, numerous protocols modify (i.e., change/add/delete) only a portion, such as a header, of data being transmitted and received. When such a modification occurs, the CRC must be recalculated for the entire data payload, even though only a small portion of the data has been modified. In the embodiments that follow, a message may comprise the data or portions of the data. Thus, the message may be the data, portions of the data and/or the data (or portions thereof) with additional data.

In one embodiment, CRC calculations may be performed on a portion of the data. For example, data may be divided into multiple blocks, where each block has a length equal to a degree of a generator polynomial. A CRC computation may then be independently computed for each of the blocks. In one embodiment, the computation on each block is performed using a lookup table and the CRC for each block is performed in parallel. The independent CRC computations may then be combined by application of an exclusive or (XOR) operation to generate a combined CRC for the modified data.

It is understood that the present embodiments of the invention may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the invention is intended to cover alternatives, modifications and equivalents of these embodiments, which are included within the scope and spirit of the invention as defined by the appended claims. Furthermore, in the following detailed description of the present embodiments of the invention, numerous specific details are set forth in order to provide a thorough understanding. However, it will be clear to those of ordinary skill in the art that the present embodiments of the invention may be practiced without such specific details.

Figure 1:
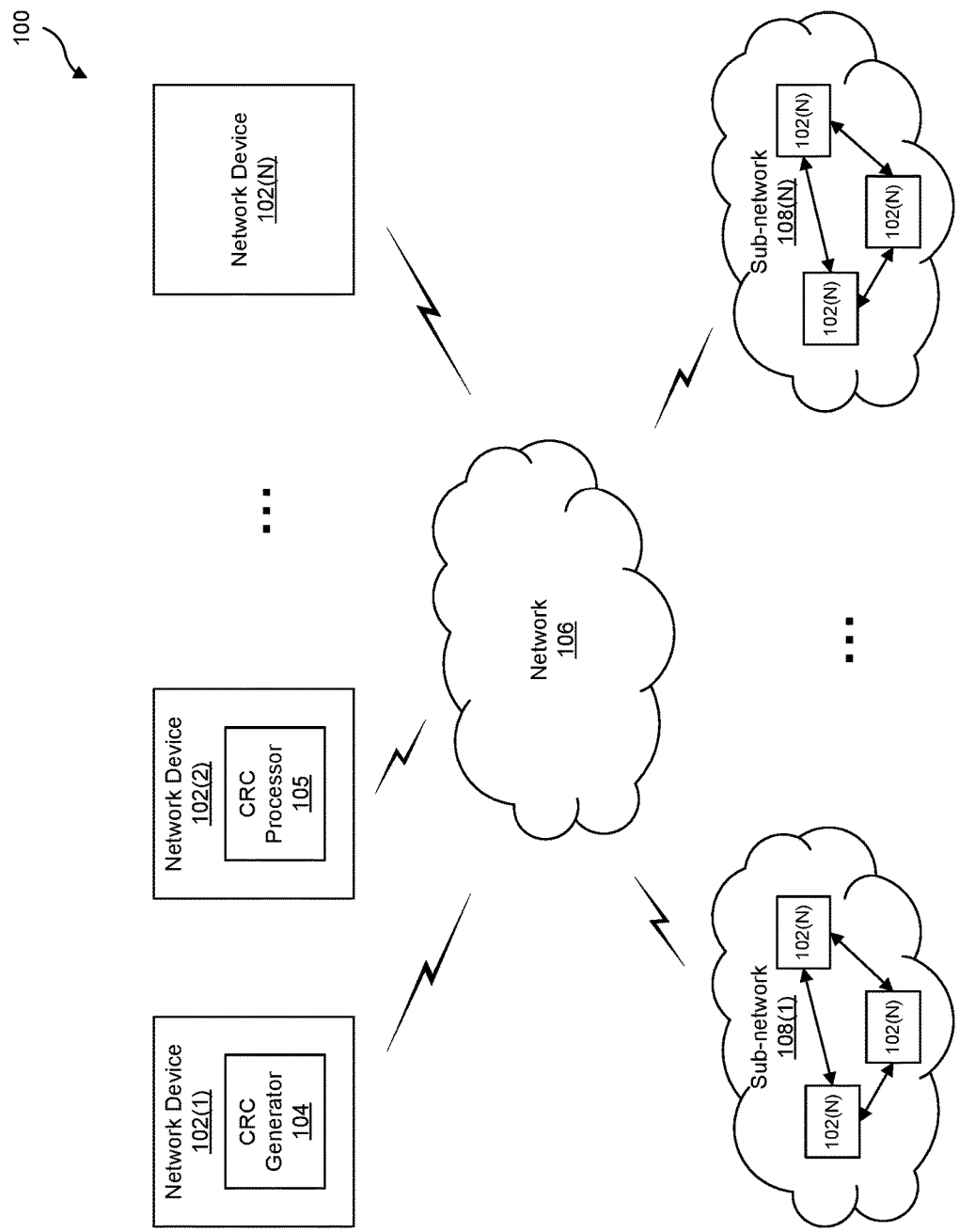
FIG. 1 is an example network environment to implement embodiments of the present disclosure.

FIG. 1 is an example network environment to implement embodiments of the present disclosure. The network environment 100 may include any number of network devices (or nodes) 102(1) to 102(N) and sub-networks 108(1) to 108(N) communicatively coupled to a network 106. Network 106 and sub-networks 108(1) to 108(N) may be, for example, a LAN, a WAN, a virtual network (such as a virtual private network (VPN)), the Internet, an intranet, an extranet, a public switched telephone network (PSTN), an infra-red network, a wireless network, and/or any combination of these and/or other networks.

Network devices (or nodes) 102(1) to 102(N) may be any type of device capable of transmitting or receiving data via a communication channel, such as a router, switch, hub, host network interface, or may be some other hardware and/or software-based component capable of transmitting and receiving data. Sub-networks 108(1) to 109(N) may be any type of network that can support data communications using any well-known protocol. Data may be transmitted between any of network devices 102(1) to 102(N) and sub-networks 108(1) to 108(N) via network 106 or using data links (such as data links between network devices 102(N) in sub-networks 108(1) to 108(N)) configured to support the same or different communication protocols and/or transmission standards.

In one embodiment, network device 102(1) is a transmission device that may transmit data to network device 102(2), which may be a receiving device. Although the communication is depicted through network 106, the network devices 102(1) and 102(2) may also communicate via any transmission medium(s), such as a wired (e.g., optical, twisted-pair copper, etc.) or wireless (e.g., 802.11, Bluetooth, etc.) link(s). Various different protocols may be used to communicate between the transmission device 102(1) and the receiving device 102(2). For example, the communication may comprise discrete messages (e.g., Ethernet frames, IP packets, etc.) that are transmitted using a network protocol (e.g., Ethernet, TCP/IP, etc.).

In another embodiment, network device 102(2) is a receiver device that may receive data from the transmission device 102(1). The data (or data stream) may comprise one or more messages received by network device 102(2). The data received may then be routed to an interface (not shown), for example, a media access controller (MAC) as found in Ethernet-based networking equipment. The interface may be configured to perform various processing operations on the data, such as buffering of the data stream for forwarding to other components in the network device, updating header information in a message, determining a next destination for a received message, etc.

According to an embodiment, each network device 102(1) to 102(N) may be configured to perform CRC-based error detection and/or correction on the data. To implement the CRC error detection, a CRC processing component 104 is configured to generate a CRC value for data input to the component. A CRC processing component may be implemented in hardware (e.g., microprocessor, logic device such as an FPGA or ASIC, etc.), in software, or combinations of hardware and software.

In one embodiment, the CRC processing component is a logic-based circuit that is configured to generate a CRC value for a message received in the data by network device 102(2). For example, in traditional hardware implementations, a circuit based on shift registers may perform the CRC calculation by handling the incoming message one bit at a time.

In some embodiments, CRC processing component 105 may further include logic for verifying whether the CRC value generated by the component for a received message matches a CRC value that is received from the transmission device 102(1) for the message. For example, the transmission device 102(1) may include a CRC generation component 104 configured to generate a CRC value for a message being sent. The CRC value may then be appended to the message and extracted by network device 102(2) from the message in the data. In this manner, CRC processing component 105 may be configured to generate a CRC value (new CRC) for the received data and use the generated value to verify the data integrity of the message received from the transmitting device.

In particular, the CRC value may be computed through binary polynomial division. For example, to generate a CRC value, the transmission device 102(1) treats binary data as a binary polynomial and performs a modulo-2 division of the polynomial by a CRC generator 104 (e.g., a CRC-32). The remainder of the division becomes the CRC value of the data, which is attached to the original data and transmitted to a receiver device 102(2). Receiving the data and CRC value, the receiver device 102(2) also performs the modulo-2 division with the received data and the same generator polynomial. Errors are detected by comparing the computed CRC value (new CRC) with the received CRC value (original CRC).

Figure 2:
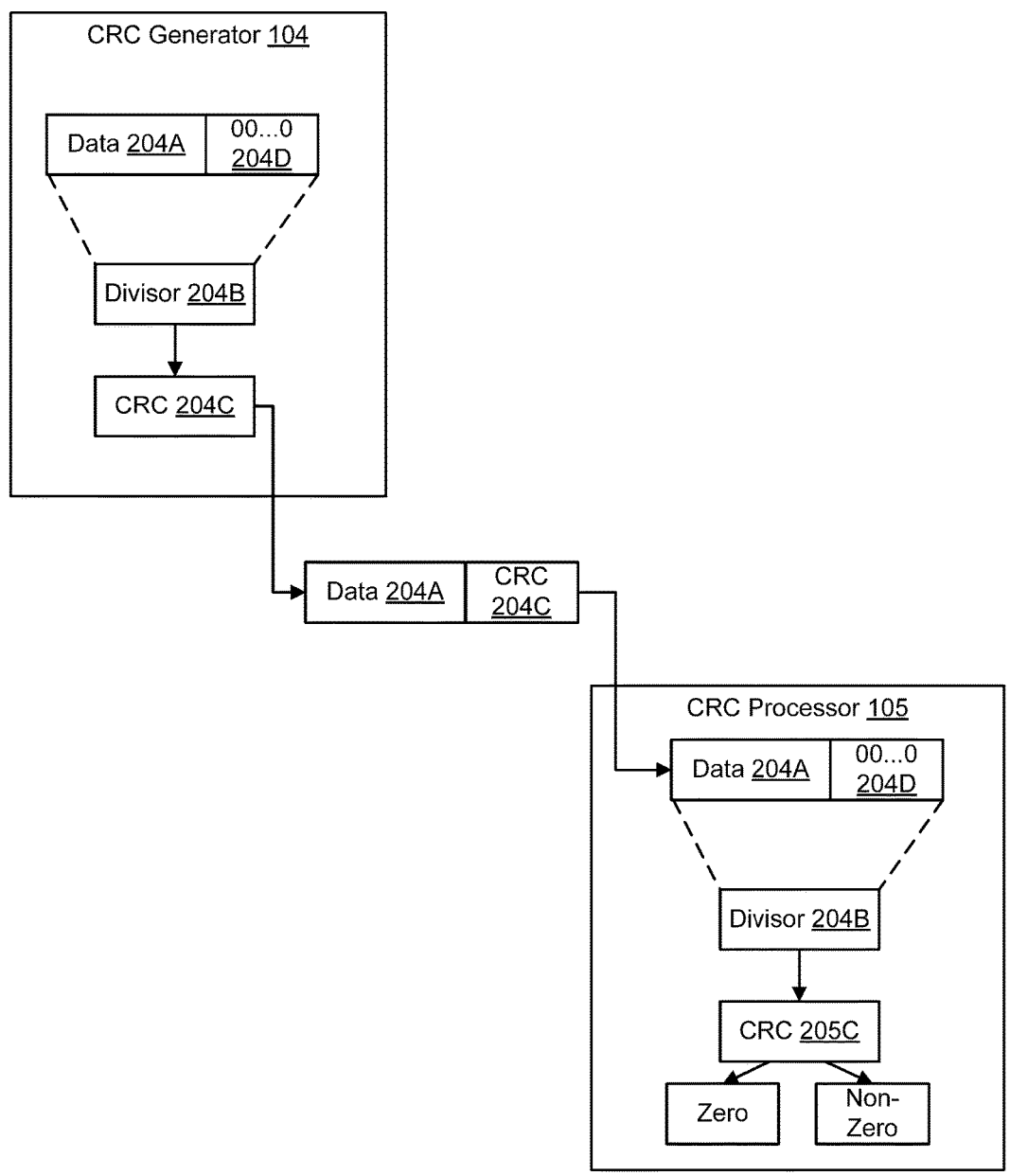
FIG. 2 illustrates the CRC generator and processor components of FIG. 1.

FIG. 2 illustrates the CRC generator and processor components of FIG. 1. During CRC error detection and correction, a special number is appended to a block of data in order to detect any changes introduced during storage or transmission from a transmission device, such as transmission device 102(1). The CRC is recalculated on retrieval or reception at a receiving device 102(2) and compared to the value originally transmitted. For example, a single corrupted bit in the data results in a one-bit change in the calculated CRC, but multiple corrupt bits may cancel each other out.

At the transmission side (CRC generator 104), the data 204A to be transmitted is divided by a predetermined divisor 204B (binary number) in order to obtain the remainder (CRC) 204C. The CRC 204C has one bit less than the divisor. Thus, if the CRC 204C is 'n' bits, the divisor 204B is 'n+1' bits. Once calculated, the transmission side appends the CRC 204C to the end of data (replacing the string of appended zeroes 204D) such that the resulting data becomes exactly divisible by the divisor 204B, i.e. the remainder becomes zero. This will become more apparent in the example that follows.

At the receiver side (CRC processor 105), the incoming data (data 204A+CRC 204C) from the transmission side is divided by the same number (the divisor 204B). If the remainder after division is zero, then there is no error in the data and the data is accepted. If, on the other hand, the remainder after division is not zero, then the data has been damaged and is rejected.

Figure 2B:
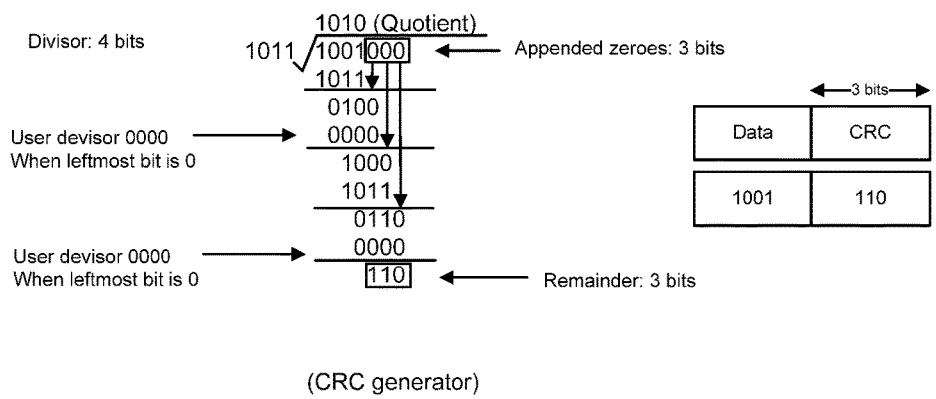
FIGS. 2B and 2C illustrate examples of CRC generation and decoding, respectively.
Figure 2C:
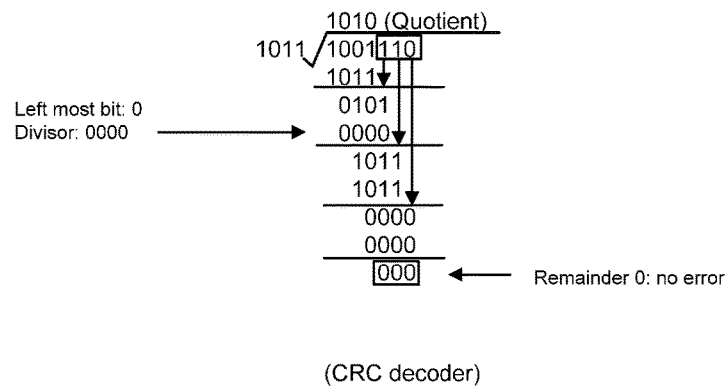

FIGS. 2B and 2C illustrate examples of generating and decoding a CRC in accordance with the generator and processor of FIG. 2. In the example, we assume that data to be transmitted is 1001 and the predetermined divisor is 1011. Initially, a string of three zeroes (000) is appended to 1011 as the divisor is four bits. Accordingly, the data becomes 1011000. The data 1011000 is then divided by 1011. As illustrated in FIG. 2B, when the leftmost bit of the dividend or remainder is zero (0), a string of zeroes of the same length as the divisor is used. Thus, in this case, the divisor 1011 is replaced by 0000. Upon completion of the calculation, the remainder (CRC 204C) is 110.

With reference to FIG. 2C, the data received at the receiver side is the data 1001 with the CRC 110 calculated at the transmission side appended thereto. Thus, the data being received is 1001110. The data is divided by the divisor 1011 until the remainder 000 is obtained. As explained above, a remainder of zero means that the transmitted data does not have any errors.

Mathematically, a CRC is computed for a fixed-length message (data) by treating the message as a string of binary coefficients of a polynomial, which is divided by a generator polynomial, with the remainder of the division used as the CRC. Thus, for an l-bit message, $a_{l-1}a_{l-2} \ldots a_0$, the message may be expressed as a polynomial as follows:

$$A(x)=a_{l-1}x^{l-1}+a_{l-2}x^{l-2}+a_{l-3}x^{l-3}+ \ldots +a_0,$$

where $a_{l-1}$ is the most significant bit (MSB) and $a_0$ is the least significant bit (LSB) of the message. Given the degree-m generator polynomial, $$G(x)=g_m x^m+g_{m-1}x^{m-1}+g_{m-2}x^{m-2}+ \ldots +g_0,$$

where $g_m=1$ and $g_i$ is 0 or 1 for all i, A(x) is multiplied by $x^m$ and divided by G(x) to find the remainder. The CRC of the message is defined as the coefficients of that remainder polynomial. Namely, the polynomial representation of the CRC is $$CRC[A(x)]=A(x)x^m \bmod G(x),$$

using polynomial arithmetic in the Galois field of two elements, or GF(2).

After CRC processing is completed, the CRC is affixed to the original message and sent through a channel (e.g., stored on a disk and subsequently retrieved, or received from a communication channel). The presence of errors may be detected by re-computing the CRC using the received message including the CRC and verifying the newly computed CRC by the same generator G(x). If the computed CRC does not match (the remainder is not zero), one or more errors have been introduced. If the computed CRC matches (the remainder is zero), the received message is assumed to be error-free, although there is a small probability that undetected errors have occurred. For a suitably chosen G(x), the probability of undetected error is approximately $2^{-m}$.

Figure 3:
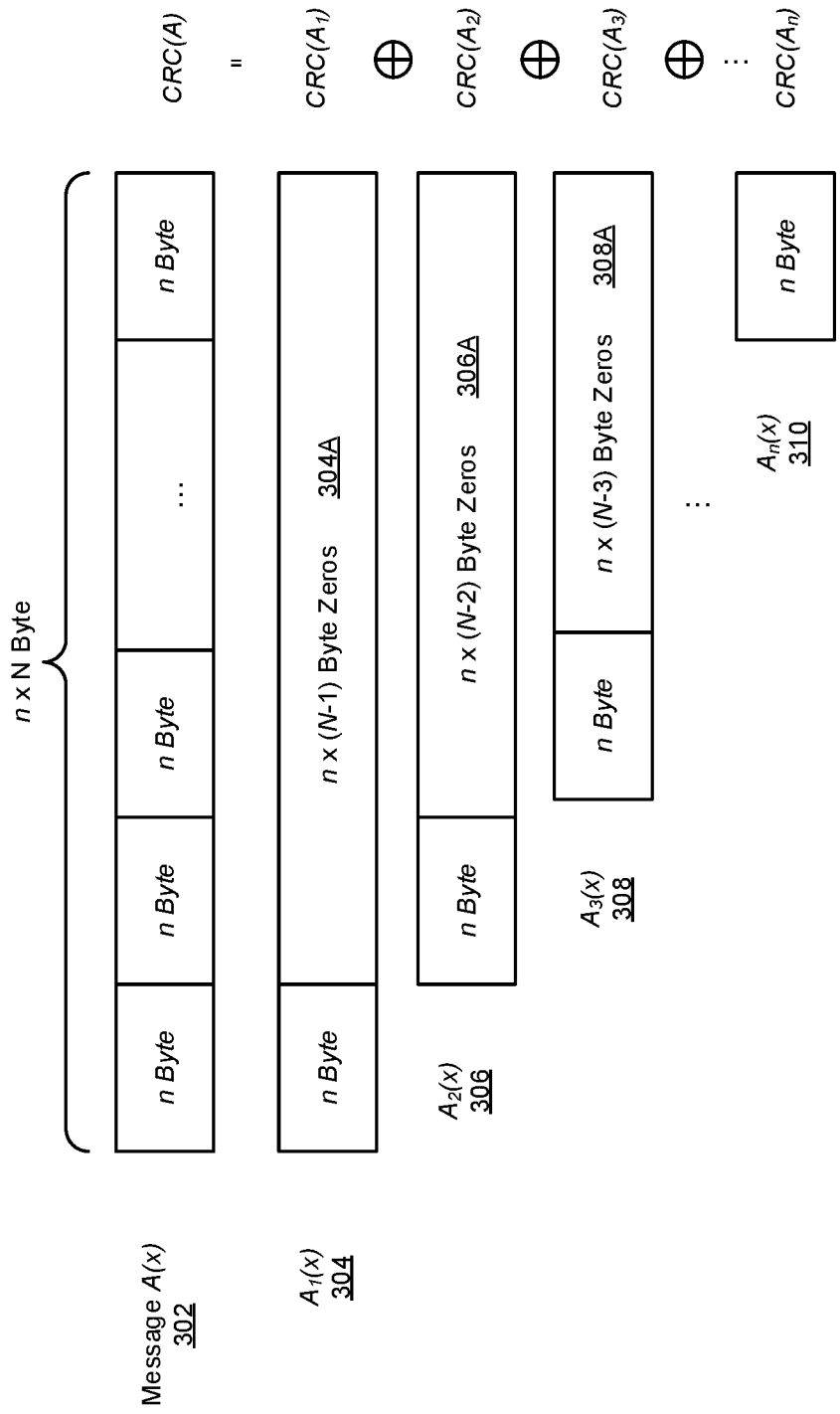
FIG. 3 illustrates a CRC calculation in accordance with the disclosed technology.

FIG. 3 illustrates a CRC calculation in accordance with the disclosed technology. While the above-disclosed CRC methods are widely used, calculation of a CRC requires checking a payload of the data (or data packet) even when only a small portion of the data has been changed or modified. For example, many protocols used to transmit data often require modifying or adding/deleting a header field in the data packet. In such as case, even though only the header is being modified, the CRC methodology is required to recalculate the CRC to account for the changes or modifications. Performing such recalculations becomes inefficient, particularly when copying the data packet from memory to CPU or other hardware.

Figure 4A:
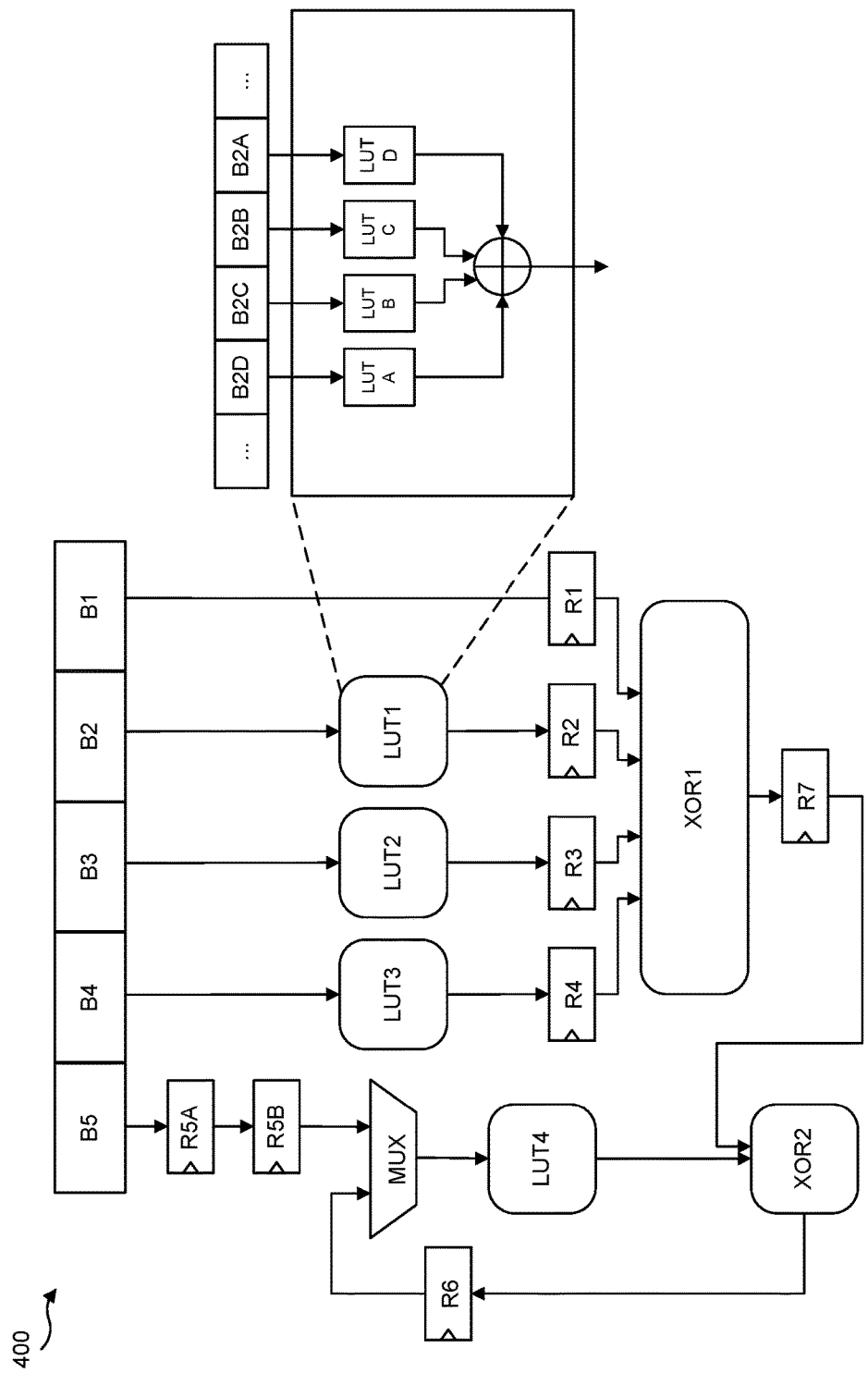
FIG. 4A illustrates a CRC architecture to implement the methodology of FIG. 3.

In the embodiment of FIG. 3, the CRC computations discussed with reference to FIGS. 2A, 2B and 2C, which were performed serially, are rearranged into a parallel configuration as depicted in FIG. 4A, described below. Incoming messages A(x) 302 are split into blocks $A_i(x)$ 304 to $A_n(x)$ 310 and a $CRC(A_1)$ to $CRC(A_n)$ is respectively calculated for each of the blocks $A_i(x)$ 304 to $A_n(x)$ 310, as explained below in more detail. To accomplish this task, we apply the following two equations:

Let $A(x)=A_1(x)A_2(x)+ \ldots +A_n(x)$ over GF(2), then given a generator polynomial G(x), $$CRC[A(x)]=\Sigma_{i=1}^{N}CRC[A_i(x)] \quad (1)$$

Equation (1) demonstrates that an incoming message A(x) 302 may be split into multiple blocks, $A_1(x)$ 304, $A_2(x)$ 306, ..., $A_N(x)$ 310, such that each block has a $CRC(A_n)$ independently calculated. In one embodiment, each calculation is performed in parallel. For example, suppose that $A(x)=a_{l-1}x^{l-1}+a_{l-2}x^{l-2}+a_{l-3}x^{l-3}+ \ldots +a_0$ represents an l-bit message, and that the message is split into b-bit blocks. For simplicity of discussion, assume that l is a multiple of b, namely l=Nb. Then, the ith block of the message is a b-bit binary substring from the (i−1)b+1st bit to the ibth bit in the original message A(x) 302, followed by l−ib zeroes. Thus, $A_i(x)=\Sigma_{k=l-ib}^{l-(i-1)b-1}a_k x^k$. FIG. 3 illustrates this example, where each block is n bytes long (or b=8n).

In the second equation,

Given B(x), a polynomial over GF(2), $$CRC[x^k B(x)]=CRC[x^k CRC[B(x)]] \text{ for any } k \quad (2)$$

Both equations (1) and (2) maybe proved using properties of GF(2).

Equation (2) enables computation of the CRC of the prefix of $A_1(x)$ including the b-bit substring of the original message $A(x)$ 302. Using this theorem, the $CRC[A_1(x)]$ may be updated after the number of trailing zeroes 304A, 306A, 308A are known. For example, as illustrated in FIG. 3, $A_1(x)$ has $n \times (N-1)$ byte trailing zeroes, and the number of trailing zeroes determines the order of $A_1(x)$. Thus, according to Equation (2), the CRC of the prefix of $A_1(x)$, including the b-bit substring of the original message, can be computed prior to updating the CRC. Once the number of trailing zeroes 304A, 306A, 308A is known, the CRC may be updated using Equation (2).

Once each of the blocks $A_1(x)$ 304, $A_2(x)$ 306, ..., $A_N(x)$ 310 have been processed, the independent CRC results can be combined to generate the CRC ($CRC(A_n)$) of the entire message.

In one non-limiting example, the total number of blocks for a message $A(x)$ 302 may be unknown and the number of CRC calculations restricted by hardware and/or software limitations. Let us assume for purposes of discussion that hardware and/or software constraints limit up to four CRC calculations simultaneously.

Applying the process described above, the CRC of the first four blocks of the incoming message may be computed as: (1) $A_1(x)$ 304 is the first block, followed by 3n bytes of zeroes. The CRC is calculated for this block using a standard CRC generator as $CRC(A_i)$; (2) $A_2(x)$ 306 is the second block, followed by 2n bytes of zeroes. The CRC is calculated for this block using a standard CRC generator as $CRC(A_2)$; (3) $A_3(x)$ 308 is the third block, followed by n bytes of zeroes. The CRC is calculated for this block using a standard CRC generator as $CRC(A_3)$; and (4) $A_4(x)$ 310 is the fourth block (without trailing zeroes). The CRC is calculated for this block using a standard CRC generator as $CRC(A_4)$.

The calculations for each of the CRCs $A_1(x)$ 304, $A_2(x)$ 306, $A_3(x)$ 308 and $A_4(x)$ 310 are combined using an XOR operation for the first n bytes of the message. The combined results are the first iteration that includes the first four blocks of the message. To complete the CRC calculations for the entire message, the process is repeated until the CRC of the last block $A_n(x)$ (end of the message) is computed.

FIG. 4A illustrates a CRC architecture to implement the methodology of FIG. 3. The architecture may be implemented as hardware, software or any combination of hardware and software. The CRC architecture 400 includes five 4-byte blocks B1-B5 as input, where four of the blocks B1-B4 are used to read new blocks from the message during each of the iterations discussed above, and block B5 is a block from the prior iteration.

The data in blocks B2-B5 may be converted into CRC values using lookup tables LUT1, LUT2 and LUT3, in which the lookup tables contain pre-calculated CRCs. Accordingly, in order to calculate a CRC for a 4-byte block (followed by one of 16 bytes, 12 bytes, 8 bytes, and 4 bytes of zeroes), four lookup tables LUT1-LUT4 are utilized.

Block B1 is not associated with a lookup table since the architecture assumes a CRC-32 generator, although other generators may be employed. If the length of a block (i.e., data bytes) is smaller than the order of the CRC generator, then the CRC value is the block value.

As shown in the expanded portion of lookup table LUT1, each of lookup tables LUT1-LUT4 may include four lookup tables LUT A, LUT B, LUT C and LUT D, where each of the four lookup tables is responsible for handling a single byte B2A, B2B, B2C or B2D (corresponding to each of the 4-bytes in one of blocks B2-B5) with a table size of 1K bytes, containing $2^8$ entries with 32 bits each. Each lookup table LUT A-LUT D may pre-compute the CRC of each byte followed by a different number of trailing zeroes. For example, in the kth block (in one iteration), there are 4 k byte zeroes added, where k=0, 1, 2, 3. The output of the lookup tables LUT1-LUT3 are then combined using an XOR operation (as shown). It is appreciated that the disclosed embodiments are non-limiting, and the number of disclosed lookup tables are not limited to the embodiments described herein.

The results of the lookup tables LUT1-LUT3 and the CRC of block B1 are combined using an XOR operation XOR1 after passing through registers R1-R4, which temporarily store data. The results are then combined using another XOR operation XOR2, after passing through register R7, with the output of lookup table LUT4 (the CRC of the value from the previous iteration).

In another embodiment, to reduce the critical path XOR1, a pre-XOR stage (not shown) may be introduced before the four-input XOR gate. Introduction of the pre-XOR stage enables the hardware and/or software of the disclosed system to be more scalable as more blocks can be added without increasing the critical path of the pipeline. For example, since XOR1 is the critical path, and the longest stage in the pipeline of the architecture depicted in FIG. 4A, after introducing the pre-XOR stage, the stage is divided into two smaller stages, which removes the criticality of the path. As a result of the pre-XOR stage, the critical path is the delay of LUT4 and a two-input XOR gate, and the throughput is 16 bytes per cycle.

In one other embodiment, block B5 may be combined with blocks B1-B4 by appending 16 bytes of zeroes using LUT4, where the CRC of block B1 is the block value. In this embodiment, the first iteration loads blocks B1-B5 (the first five blocks) from the message. A multiplexer MUX selects block B5, such that the first five blocks B1-B5 are calculated in the first iteration. The registers R5A and R5B act as a delay for two clock cycles (for synchronization) while the CRCs of blocks B1-B4 are calculated and combined. Following the first iteration, four blocks are loaded as disclosed above, and the multiplexer MUX chooses the result from the previous iteration, which is temporarily stored in register R6 as the output of the XOR2 operation.

Figure 4B:
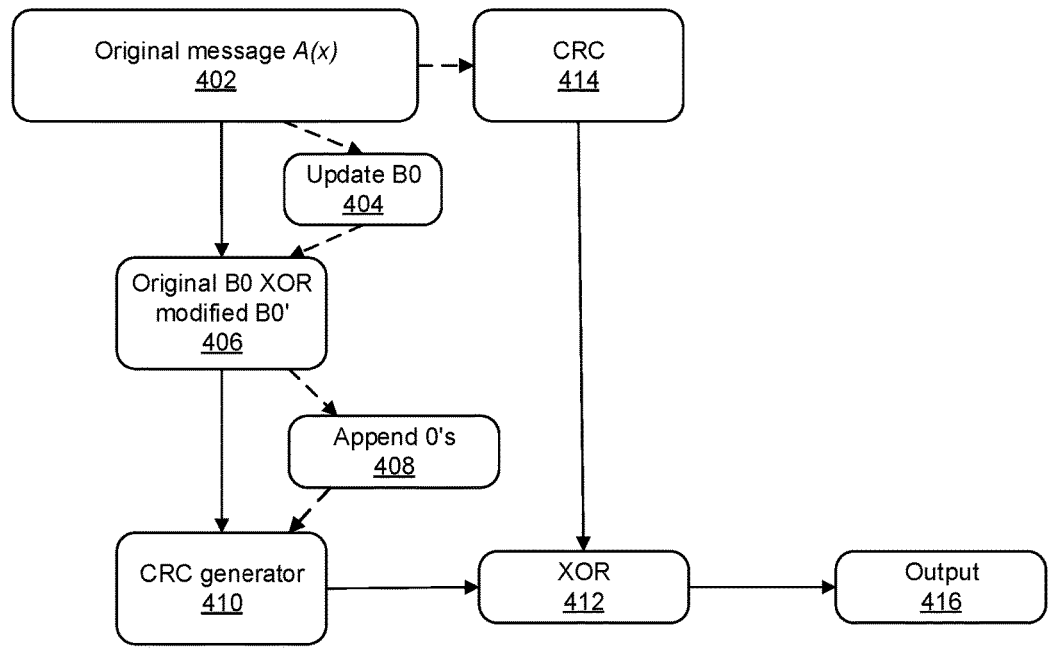
FIG. 4B illustrates a flow diagram of a CRC computation in accordance with the architecture of FIG. 4A.

FIG. 4B illustrates a flow diagram of a CRC computation in accordance with the architecture of FIG. 4A. The computations discussed with reference to FIG. 4B are implemented using a network device 102, and in accordance with the architecture of FIG. 4A. However, it is appreciated that the any one or more of the components and devices depicted in FIGS. 1, 2, 7 and 8 may also be employed to implement the methodology.

At 402, an original message $A(x)$ 302, including the originally calculated CRC 414, from a transmission device 102(1) is received by a receiver device 102(2). In the following example, the original message $A(x)$ 302 is equal to 0x12345678 with a CRC-16 value of 0x347B.

The original message $A(x)$ 302 is split into blocks $A_1(x)$ 304 to $A_n(x)$ 310 (FIG. 3). In one embodiment, the blocks $A_1(x)$ 304 to $A_n(x)$ 310 are divided into fixed sizes equal to a degree of a generator polynomial. In this example, the fixed sizes of each block have a length of 16-bits. Thus, the original message may be split into two blocks—the original block B0 is '0x1234' and original block B1 is '0x5678.'

For purposes of discussion, let us assume that the data in one of the original blocks B0 and B1 of the original message $A(x)$ 302 has been modified. For example, the original message $A(x)$ 302 has been modified to equal 0x12335678. In this case, original block B0 has been modified from '0x1234' to modified block B0' as '0x1233' and original block B1 remains unchanged as '0x5678.'

At 404, the original block B0 is updated from '0x1234' to modified block B0' as '0x1233' to reflect this modification at 404.

At 406, a CRC calculation is performed on the original block B0 and the modified block B0' as CRC((B0) XOR B0'))=CRC((0x1234) XOR (0x1233))=0x0007. After calculating the CRC, trailing zeroes are appended to the calculated value at 408. For example, since each block is 16-bits in length, zeroes are appended to '0x0007' to form '0x00070000.'

The CRC calculation is performed by the CRC generator at 410, which results in CRC((B0) XOR B0')*$X^{16m}$)=CRC (0x00070000)=0xC1B1.

The result of the CRC generator at 410, namely '0xC1B1,' is then XOR'ed with the CRC 414 of the original message A(x) 302 at 412 to result in the following output 0xC1B1 XOR 0x347B=0xF5CA at 416. The output 0xF5Ca, which is equal to the CRC(0x12335678).

The process may be repeated for multiple blocks that have been modified.

Figure 5:
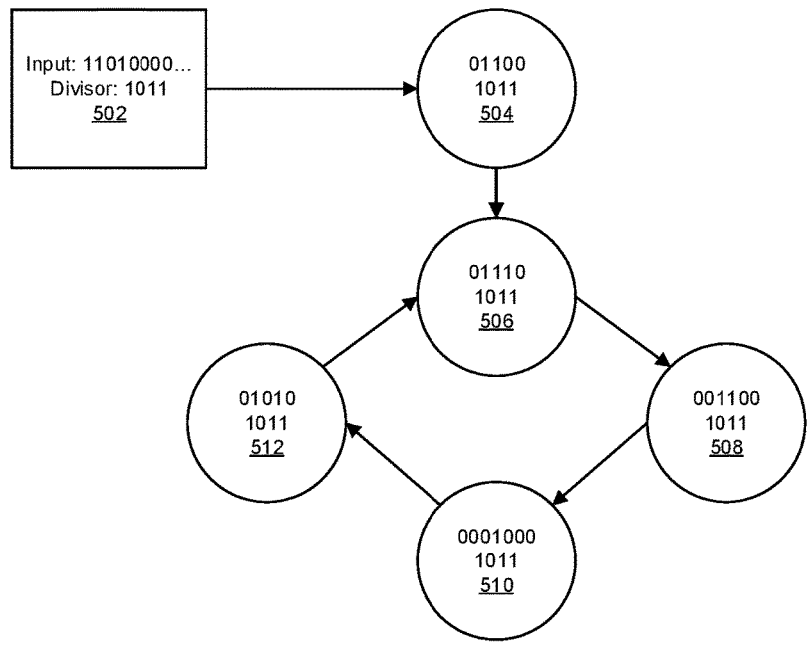
FIG. 5 illustrates an example of a CRC computation with appended zeroes falling into a loop

In one embodiment, as illustrated in FIG. 5, a CRC computation with appended zeroes falls into a loop. As illustrated, the input data at 502 is '11010000 . . . ' with a divisor of '1011.' Applying a CRC computation to the input data results in a first condition subtraction of '01100' with a divisor of '1011' at 504. Applying another CRC computation to '01100' results in a second conditional subtraction of '01110' with a divisor of '1011' at 506. The CRC computation is applied to the results at 508, 510 and 512, until performing a CRC on '01010' at 512 results in a conditional subtraction equal to the first conditional subtraction at 506 (i.e., a loop has occurred). If such a loop occurs, and the length of the loop (i.e., the number of states in the loop) is less than a predefined value, the remaining CRC calculations may be stopped.

Figure 6:
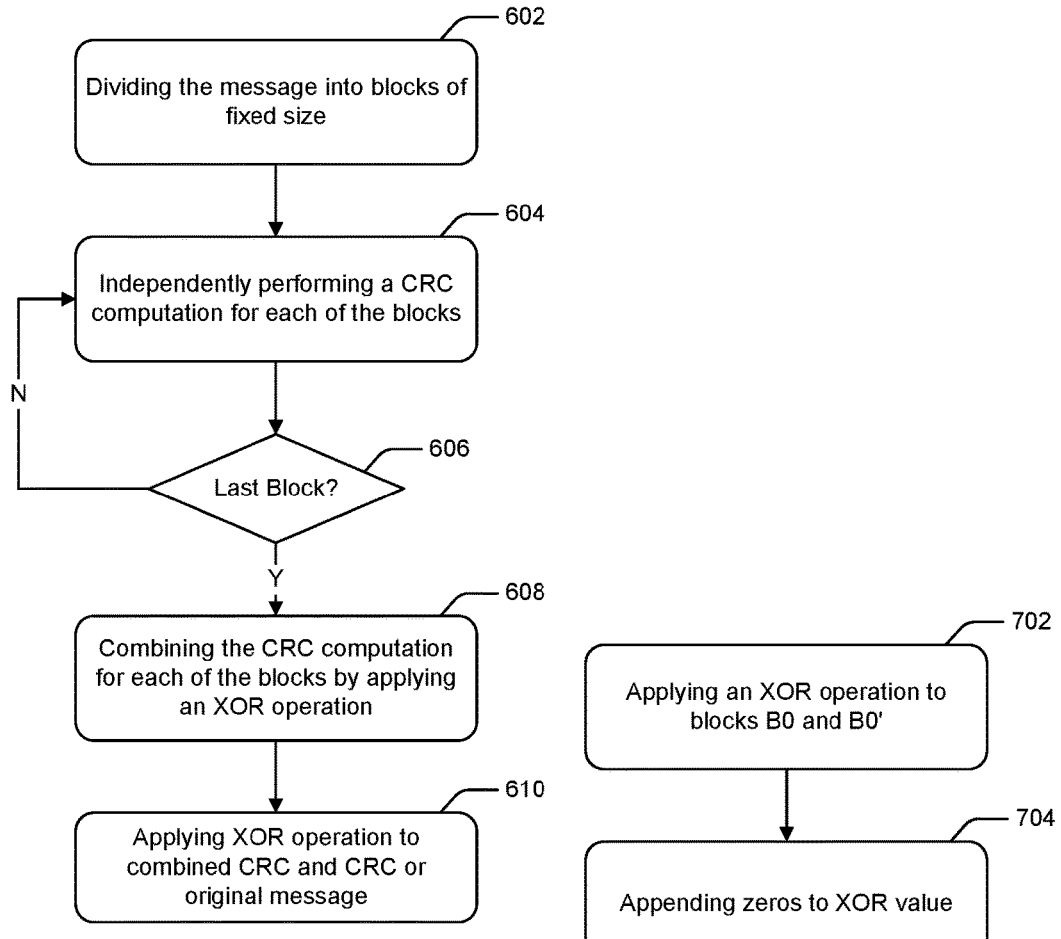
FIGS. 6 and 7 illustrate flow diagrams for implementing the methodology of the disclosed technology in accordance with the systems and components depicted in FIGS. 1, 2, 4A and 8.
Figure 7:
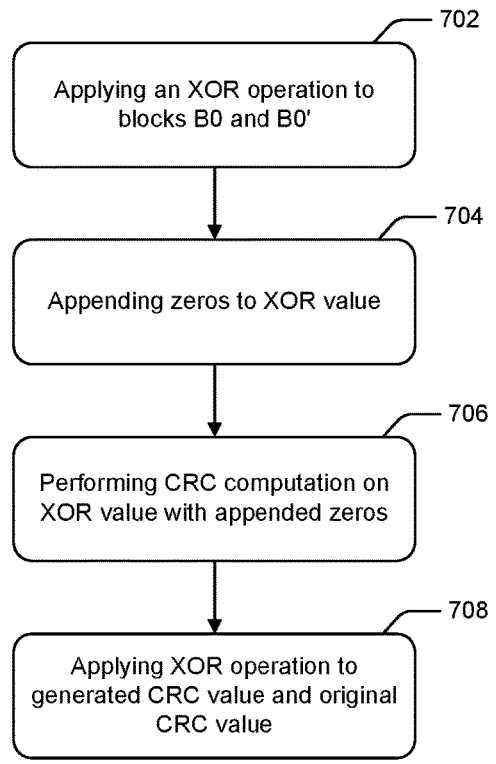

FIGS. 6 and 7 illustrate flow diagrams for implementing the methodology of the disclosed technology in accordance with the systems and components depicted in FIGS. 1, 2, 4A and 8. In the examples that follow, a network device is implementing the procedures. However, it is appreciated that any system, device or component may be used to implement the following procedures.

With reference to FIG. 6, an original message A(x) 302 is divided or split into multiple blocks $A_1(x)$ 304 to $A_n(x)$ 310, each block having a fixed size length at 602. The fixed size, as explained above, directly corresponds to the length of the generator polynomial. For example, the CRC algorithm uses a generator polynomial parameter. A polynomial is represented as one of the following: a polynomial character vector such as '$x^3+x^2+1$'; a binary row vector containing the coefficients in descending order of powers. For example, [1 1 0 1] represents the polynomial $x^3+x^2+1$; and an integer row vector containing the powers of nonzero terms in the polynomial, in descending order. For example, [3 2 0] represents the polynomial $x^3+x^2+1$.

In one embodiment, the fixed size length is pre-defined and unrelated to the generator polynomial.

At 604, each of the blocks $A_1(x)$ 304 to $A_n(x)$ 310 has a CRC computation independently applied thereto. Accordingly, a $CRC(A_1)$ to $CRC(A_n)$ is generated, where each of the generated CRCs correspond to one of the blocks $A_i(x)$ 304 to $A_n(x)$ 310.

The network device 102 determines whether the CRC of the last block $A_n(x)$ 310 has been calculated at 606. If the network device 102 determines that the CRC of the last block $A_n(x)$ 310 has been calculated, then the process proceeds to 608 where the generated CRCs $CRC(A_1)$ to $CRC(A_n)$ are combined by applying an XOR operation to generate a combined CRC. Otherwise, the process repeats (i.e. the process is iterative) until the CRC of the last block $A_n(x)$ 310 is calculated. In one embodiment, the calculations are performed in parallel.

For example, and as described in the example above, combining every CRC using XOR results in the CRC for the first n bytes of the message (where the message is of sufficient length to require more calculations than the hardware/software can handle). Thus, when necessary, each iteration of processing blocks results in a combined CRC calculation. For purposes of discussion, we refer to the combined CRC for the first iterative process as $CRC_1$. In a second (subsequent) iteration, the next m blocks are processed to produce another combined CRC (referred to herein as $CRC_2$). The result of $CRC_2$ combined with CRC [$x^{4 \cdot 8 \cdot r}$ $CRC_1$], assuming 4 blocks are processed with each iteration, is the CRC for the first eight blocks when applying Equation (2).

In one embodiment, the network device 102 determines a size of the last block $A_n(x)$ 310. When the message size is not a multiple of 4n (the number of bytes processed in each iteration), a CRC computation will result in an error. More specifically, if the last block $A_n(x)$ 310 has less than 4n bytes, then only a portion (i.e., the number of bytes in the block) of the 4n bytes should be used. In this case, the number of bytes in the block will occupy the lower bytes (e.g., lower 3-bytes) of the input data of the previous iteration. The remaining input data (up to 4 bytes) are filled with the CRC from the previous iteration, and any remaining bytes with zeroes. Implementation may be accomplished, for example, by inserting multiplexers (not shown) between each of blocks B1-B4 and the corresponding lookup tables (LUT1-LUT3) and register R1 (in the case of block B1) to the architecture depicted in FIG. 4A.

Since the last block size is between 1 and 16 (for a 16-bit message), it can be encoded with four bits: '0000' being size 1, '0001' being size 2, etc. For purposes of this example, assume the 4-bit encoding is w=$w_3w_2w_1w_0$. Thus, in the last iteration, 16-bytes consisting of the last block $A_n(x)$ 310 preceded by zeroes are loaded. A value is selected from the multiplexers from the previous iteration depending on w. For example, a byte is selected from a multiplexer corresponding to LUT1 from the previous iteration (the last byte) when the last block size is 1, namely w=0000. Otherwise, the last block $A_n(x)$ 310 is selected. Similarly, a multiplexer corresponding to LUT2 selects the previous iteration when the last block size is 1 or 2. In general, the kth rightmost multiplexer (rightmost in FIG. 4A, not shown) selects the previous iteration if the last block size is between k−3 and k. Prior to the last iteration, the multiplexers corresponding to LUT1-LUT3 select original data, and the multiplexer MUX (corresponding to LUT4 in FIG. 4A) selects the last iteration.

At 610, the combined CRC (i.e., the XOR'ed CRCs of blocks $A_1(x)$ 304 to $A_n(x)$ 310) are XOR'ed with the CRC of the original message A(x) and the results are output.

Referring to FIG. 7, the process details network device 102 independently performing a CRC computation for each of the blocks $A_1(x)$ 304 to $A_n(x)$ 310. At 702, for each block that has been modified (i.e. a block from the original message A(x) has been modified from a corresponding block of the received/incoming message), an XOR operation is applied to the original block B0 and the modified block B0' as CRC(B0 XOR B0') to generate a CRC value. Zeroes are appended to the CRC value at 704, as explained in detail above. At 706, the CRC value with the appended zeroes has an XOR operation applied thereto, which is then XOR'ed with the CRC value of the original message A(x) at 708.

Figure 8:
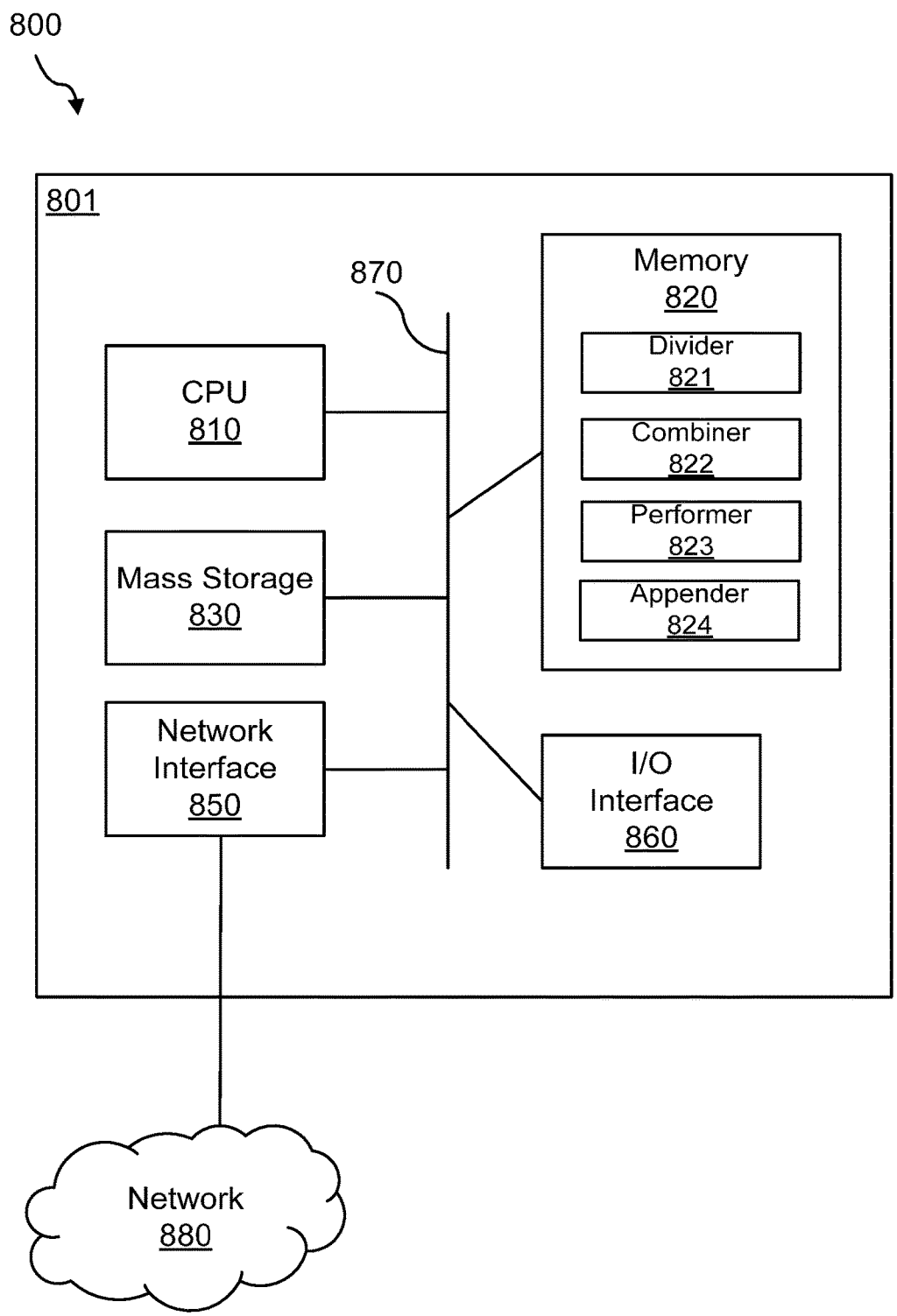
FIG. 8 illustrates a block diagram of a network system that can be used to implement various embodiments.

FIG. 8 is a block diagram of a network device 800 that can be used to implement various embodiments. Specific network devices 800 may utilize all of the components shown, or only a subset of the components, and levels of integration may vary from device to device. Furthermore, the network device 800 may contain multiple instances of a component, such as multiple processing units, processors, memories, transmitters, receivers, etc. The network device 800 may comprise a processing unit 801 equipped with one or more input/output devices, such as network interfaces, storage interfaces, and the like. The processing unit 801 may include a central processing unit (CPU) 810, a memory 820, a mass storage device 830, and an I/O interface 860 connected to a bus 870. The bus 870 may be one or more of any type of several bus architectures including a memory bus or memory controller, a peripheral bus or the like.

The CPU 810 may comprise any type of electronic data processor. The memory 820 may comprise any type of system memory such as static random access memory (SRAM), dynamic random access memory (DRAM), synchronous DRAM (SDRAM), read-only memory (ROM), a combination thereof, or the like. In an embodiment, the memory 820 may include ROM for use at boot-up, and DRAM for program and data storage for use while executing programs. In embodiments, the memory 820 is non-transitory. In one embodiment, the memory 820 includes a divider module 821 to divide messages into blocks, a combiner module 822 that combines the CRC computation for each block by applying an XOR operation, a performer module 823 to independently perform a CRC computation on each of the blocks, and an appender module 824 that appends trailing zeroes to the XOR value.

The mass storage device 830 may comprise any type of storage device configured to store data, programs, and other information and to make the data, programs, and other information accessible via the bus 870. The mass storage device 830 may comprise, for example, one or more of a solid state drive, hard disk drive, a magnetic disk drive, an optical disk drive, or the like.

The processing unit 801 also includes one or more network interfaces 850, which may comprise wired links, such as an Ethernet cable or the like, and/or wireless links to access nodes or one or more networks 880. The network interface 850 allows the processing unit 801 to communicate with remote units via the networks 880. For example, the network interface 850 may provide wireless communication via one or more transmitters/transmit antennas and one or more receivers/receive antennas. In an embodiment, the processing unit 801 is coupled to a local-area network or a wide-area network for data processing and communications with remote devices, such as other processing units, the Internet, remote storage facilities, or the like.

In some embodiments, the network device 800 for performing a CRC includes a non-transitory memory storage 820 comprising instructions and one or more processors 810 in communication with the memory 820. The one or more processors 810 execute the instructions to divide a data into a plurality of blocks, each of the plurality of blocks having a fixed size equal to a degree of a generator polynomial, independently perform a CRC computation for each of the plurality of blocks, and combine the CRC computation for each of the plurality of blocks by application of an exclusive or (XOR) operation.

There are many benefits to using embodiments of the present disclosure. For example, in the disclosed technology for hardware offloading, only the (B0 XOR B1) value, length of appended zeroes, and the original message CRC value is sent to the hardware. Additionally, use of lengthy appended zeroes can be utilized by parallel processing approaches to further improve performance, and the methodology can be used to add a header and to remove a header CRC calculation based on equation (1). To add a header, a CRC of the header is calculated with zeroes, then XOR'ed with the original message CRC value. For removing a header, the CRC of header is calculated with zeroes, then XOR'ed with the original message CRC value. Moreover, this methodology can be used in parallel with a CRC calculation and can be used in both software and hardware (or a combination thereof). Other advantages include: only portions of the data needs to be processed in an update and is thus cache friendly and faster, no packet copy process is required, and only the modified block needs to be copied, which can be stored in metadata/descriptor. Thus, the process is easy to implement and can reuse original CRC calculations to thereby provide less latency even when CRC calculation is not the bottleneck.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

In accordance with various embodiments of the present disclosure, the methods described herein may be implemented using a hardware computer system that executes software programs. Further, in a non-limited embodiment, implementations can include distributed processing, component/object distributed processing, and parallel processing. Virtual computer system processing can be constructed to implement one or more of the methods or functionalities as described herein, and a processor described herein may be used to support a virtual processing environment.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for performing a cyclic redundancy check (CRC), comprising:
    dividing data into a plurality of blocks, each of the plurality of blocks having a fixed size equal to a degree of a generator polynomial;
    for each block in which at least one bit has been modified, applying the XOR operation to the block for which the at least one bit has been modified and a corresponding original block of the data to generate an XOR value;
    independently performing a CRC computation for each of the plurality of blocks; and
    combining an output of the CRC computation for each of the plurality of blocks by application of an exclusive or (XOR) operation.

2. The method of claim 1, wherein the independently performing a CRC computation for each of the plurality of blocks comprises:
    appending trailing zeroes to the XOR value, wherein the CRC computation is performed on the XOR value including the appended trailing zeroes to generate a CRC value; and
    applying the XOR operation to the generated CRC value and a generated CRC value of the data.

3. The method of claim 2, wherein for each block comprised of divided data, including the trailing zeroes, having a length smaller than the degree of the generator polynomial, the CRC value is a value of the block converted into a CRC value.

4. The method of claim 2, further comprising stopping each of the CRC computations in response to the XOR message with appended trailing zeroes falling into a loop and a length of the loop is less than a predefined value.

5. The method of claim 1, wherein the CRC computations are independently performed in parallel.

6. The method of claim 1, wherein the CRC computations are performed by accessing one or more lookup tables that include pre-calculated CRCs.

7. The method of claim 1, further comprising:
    determining whether the CRC computation is being performed on a last block of the plurality of blocks,
    in response to determining that the CRC computation has been performed on the last block, combining the CRC computation for each of the plurality of blocks.

8. A non-transitory computer-readable medium storing computer instructions for performing a cyclic redundancy check (CRC), that when executed by one or more processors, perform the steps of:
    dividing data into a plurality of blocks, each of the plurality of blocks having a fixed size equal to a degree of a generator polynomial;
    for each block in which at least one bit has been modified, applying the XOR operation to the block for which the at least one bit has been modified and a corresponding original block of the data to generate an XOR value;
    independently performing a CRC computation for each of the plurality of blocks; and
    combining an output of the CRC computation for each of the plurality of blocks by application of an exclusive or (XOR) operation.

9. The non-transitory computer-readable medium of claim 8, wherein the independently performing a CRC computation for each of the plurality of blocks, when executed by one or more processors, perform the steps of:
    appending trailing zeroes to the XOR value, wherein the CRC computation is performed on the XOR value including the appended trailing zeroes to generate a CRC value; and
    applying the XOR operation to the generated CRC value and a CRC value of the data.

10. The non-transitory computer-readable medium of claim 9, wherein for each block comprised of divided data, including the trailing zeroes, having a length smaller than the degree of the generator polynomial, the CRC value is a value of the block converted into a CRC value.

11. The non-transitory computer-readable medium of claim 9, wherein the one or more processors further perform the step of stopping each of the CRC computations in response to the XOR message with appended trailing zeroes falling into a loop and a length of the loop is less than a predefined value.

12. The non-transitory computer-readable medium of claim 8, wherein the CRC computations are independently performed in parallel.

13. The non-transitory computer-readable medium of claim 8, wherein the CRC computations are performed by accessing one or more lookup tables that include pre-calculated CRCs.

14. The non-transitory computer-readable medium of claim 8, wherein the one or more processors further perform the steps of:
    determining whether the CRC computation is being performed on a last block of the plurality of blocks,
    in response to determining that the CRC computation has been performed on the last block, combining the CRC computation for each of the plurality of blocks.

15. A network device for performing a cyclic redundancy check (CRC), comprising:
    a non-transitory memory storage comprising instructions; and one or more processors in communication with the memory, wherein the one or more processors execute the instructions to:

divide data into a plurality of blocks, each of the plurality of blocks having a fixed size equal to a degree of a generator polynomial;

for each block in which at least one bit has been modified, apply the XOR operation to the block for which the at least one bit has been modified and a corresponding original block of the data to generate an XOR value;

independently perform a CRC computation for each of the plurality of blocks; and combine an output of the CRC computation for each of the plurality of blocks by application of an exclusive or (XOR) operation.

16. The network device of claim 15, wherein for the independently performing a CRC computation for each of the plurality of blocks, the one or more processors further execute the instructions to:

append trailing zeroes to the XOR value, wherein the CRC computation on the XOR value including the appended trailing zeroes to generate a CRC value; and apply the XOR operation to the generated CRC value and a generated CRC value of the data.

17. The network device of claim 16, wherein for each block comprised of divided data, including the trailing zeroes, having a length smaller than the degree of the generator polynomial, the CRC value is a value of the block converted into a CRC value.

18. The network device of claim 16, wherein the one or more processors further execute the instructions to stop each of the CRC computations in response to the XOR message with appended trailing zeroes falling into a loop and a length of the loop is less than a predefined value.

19. The network device of claim 15, wherein the CRC computations are independently performed in parallel.

20. The network device of claim 15, wherein the CRC computations are performed by accessing one or more lookup tables that include pre-calculated CRCs.

21. The network device of claim 15, wherein the one or more processors further execute the instructions to:

determine whether the CRC computation is being performed on a last block of the plurality of blocks, in response to determining that the CRC computation has been performed on the last block, combine the CRC computation for each of the plurality of blocks.

* * * * *